United States Patent
Wu

(10) Patent No.: US 7,362,647 B2
(45) Date of Patent: Apr. 22, 2008

(54) POWER CONTROL CIRCUIT

(75) Inventor: Jui-Jen Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/529,882

(22) Filed: Sep. 30, 2006

(65) Prior Publication Data

US 2008/0013394 A1    Jan. 17, 2008

Related U.S. Application Data

(60) Provisional application No. 60/830,172, filed on Jul. 12, 2006.

(51) Int. Cl.
*G11C 11/00* (2006.01)
(52) U.S. Cl. ............................. 365/226; 365/205
(58) Field of Classification Search .......... 365/226, 365/205
See application file for complete search history.

(56) References Cited

U.S. PATENT DOCUMENTS

| | | | | |
|---|---|---|---|---|
| 5,198,706 A | * | 3/1993 | Papaliolios | 326/37 |
| 5,384,748 A | * | 1/1995 | Sanemitsu | 365/229 |
| 6,424,178 B1 | * | 7/2002 | Harrison | 326/93 |
| 7,020,041 B2 | | 3/2006 | Somasekhar et al. | 365/229 |
| 2003/0107671 A1 | * | 6/2003 | Castro et al. | 348/395.1 |
| 2004/0189577 A1 | * | 9/2004 | Lin et al. | 345/98 |
| 2005/0146913 A1 | * | 7/2005 | Madan | 365/145 |
| 2006/0067134 A1 | | 3/2006 | Zhang et al. | 365/189.02 |

OTHER PUBLICATIONS

Masanao Yamaoka et al., "Low-Power Embedded SRAM Modules with Expanded Margins for Writing", 2005 IEEE International Solid-State Circuits Conference, Feb. 2005, vol. 0-7803-8904-2/05, pp. 480-481, 611.

K. Zhang et al., "A 3-GHz 70Mb SRAM in 65nm CMOS Technology with Integrated Column-Based Dynamic Power Supply", 2005 IEEE International Solid-State Circuits Conference, Feb. 2005, vol. 0-7803-8904-2/05, pp. 474-475, 611.

S. Ohbayashi et al. "A 65 nm SoC Embedded 6T-SRAM Design for Manufacturing with Read and Write Cell Stabilizing Circuits", 2006 Symposium on VLSI Circuits Digest of Technical Papers, 2006 IEEE.

* cited by examiner

*Primary Examiner*—Michael T Tran
(74) *Attorney, Agent, or Firm*—Kirkpatrick & Lockhart Preston Gates Ellis LLP

(57) ABSTRACT

A power control circuit for an integrated circuit module includes at least one switch device coupled between a supply voltage and a node of the integrated circuit module; and a switch control module having a first terminal coupled to the switch device and a second terminal coupled to the node of the integrated circuit module for controlling the switch device to pass the supply voltage to the node with or without a substantial voltage drop depending on an operation mode of the integrated circuit module, the switch control module having at least one capacitor for selectively discharging the node, thereby creating the substantial voltage drop for the supply voltage across the switch device.

21 Claims, 3 Drawing Sheets

POWER CONTROL CIRCUIT

The present application claims the benefit of U.S. Provisional Patent Application 60/830,172, which was filed on Jul. 12, 2006, entitled "Fast Response Power-Down Switching Circuit."

BACKGROUND

The present invention relates generally to integrated circuit designs, and more particularly to a power control circuit for down-shifting a supply voltage of an integrated circuit module depending on various operation modes.

Random access memory (RAM) is typically used for temporary storage of data in a computer system. There are several types of RAM, including dynamic random access memory (DRAM) and static random access memory (SRAM). SRAM retains its memory state without the need of any data refresh operations as long as it is supplied with power. A SRAM device is comprised of an array of "cells," each of which retains one "bit" of data. A typical SRAM cell may include two cross coupled inverters and two access transistors connecting the inverters to complementary bit-lines. The two access transistors are controlled by word-lines to select the cell for read or write operation. In read operation, the access transistors are switched on to allow the charges retained at storage nodes of the cross coupled inverters be read via the bit line and its complement. In write operation, the access transistors are switched on and the voltage on the bit line or the complementary bit line is raised to a certain level to flip the memory state of the cell. Conventionally, the cell is designed to operate with a down-shifted supply voltage in the write operation than in the read operation in order to increase the write margin.

FIG. 1 shows one type of conventional circuit 100 for down-shifting the power supplied to an array of SRAM cells during write operation. A power control circuit 110 is connected to a core supply voltage (CVDD) and provides an intermediate supply voltage (CVDDi) to the SRAM array 120. A signal A controls PMOS transistor P1, such that CVDDi output from the power control circuit 110 can switch between CVDD and a lower voltage depending on the operation mode of the SRAM array 120. In read operation, signal A is designed to be a logic "low" that turns on the PMOS transistor P1, thereby passing CVDD to the SRAM array 120 without a substantial voltage drop. In such case, CVDDi substantially equals CVDD. In write operation, signal A is designed to be a logic "high" that turns off the PMOS transistor P1, thereby forcing power to pass through MOS diode P2 with a substantial voltage drop. In such case, CVDDi is lower than CVDD by a voltage drop across MOS diode P2. The lower CVDDi increases the write margin for the cells within the SRAM array 120.

One skilled in the art of SRAM design would appreciate that it takes a relatively long time for the PMOS transistor P1 to be completely turned off during the write operation. As a result, the response time of the power control circuit 110 is slow, which in turn, degrades the performance of the SRAM array 120.

As such, what is needed is a power control circuit that lowers a supply voltage in a short response time for an integrated circuit module that requires the supply voltage to be varied at different levels depending on various operation modes.

SUMMARY

The present invention discloses a power control circuit for an integrated circuit module that requires the supply voltage to be varied at different levels depending on various operation modes. In one embodiment of the invention, the power control circuit includes at least one switch device coupled between a supply voltage and a node of the integrated circuit module; and a switch control module having a first terminal coupled to the switch device and a second terminal coupled to the node of the integrated circuit module for controlling the switch device to pass the supply voltage to the node with or without a substantial voltage drop depending on an operation mode of the integrated circuit module, the switch control module having at least one capacitor for selectively discharging the node, thereby creating the substantial voltage drop for the supply voltage across the switch device.

The construction and method of operation of the invention, however, together with additional objectives and advantages thereof will be best understood from the following description of specific embodiments when read in connection with the accompanying drawings.

DESCRIPTION

This invention is related to a power control circuit that lowers a supply voltage in a short response time for an integrated circuit module that requires the supply voltage to be varied at different levels. The following merely illustrates the various embodiments of the present invention for purposes of explaining the principles thereof. It is understood that those skilled in the art of integrated circuit design will be able to devise various equivalents that, although not explicitly described herein, embody the principles of this invention.

References in the specification to "one embodiment," "an embodiment," "an example embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure or characteristic is described in connection with an embodiment, it is submitted that it is within the knowledge of one of ordinary skill in the art to implement such feature, structure or characteristic in connection with other embodiments whether or not explicitly described.

Figure 1:
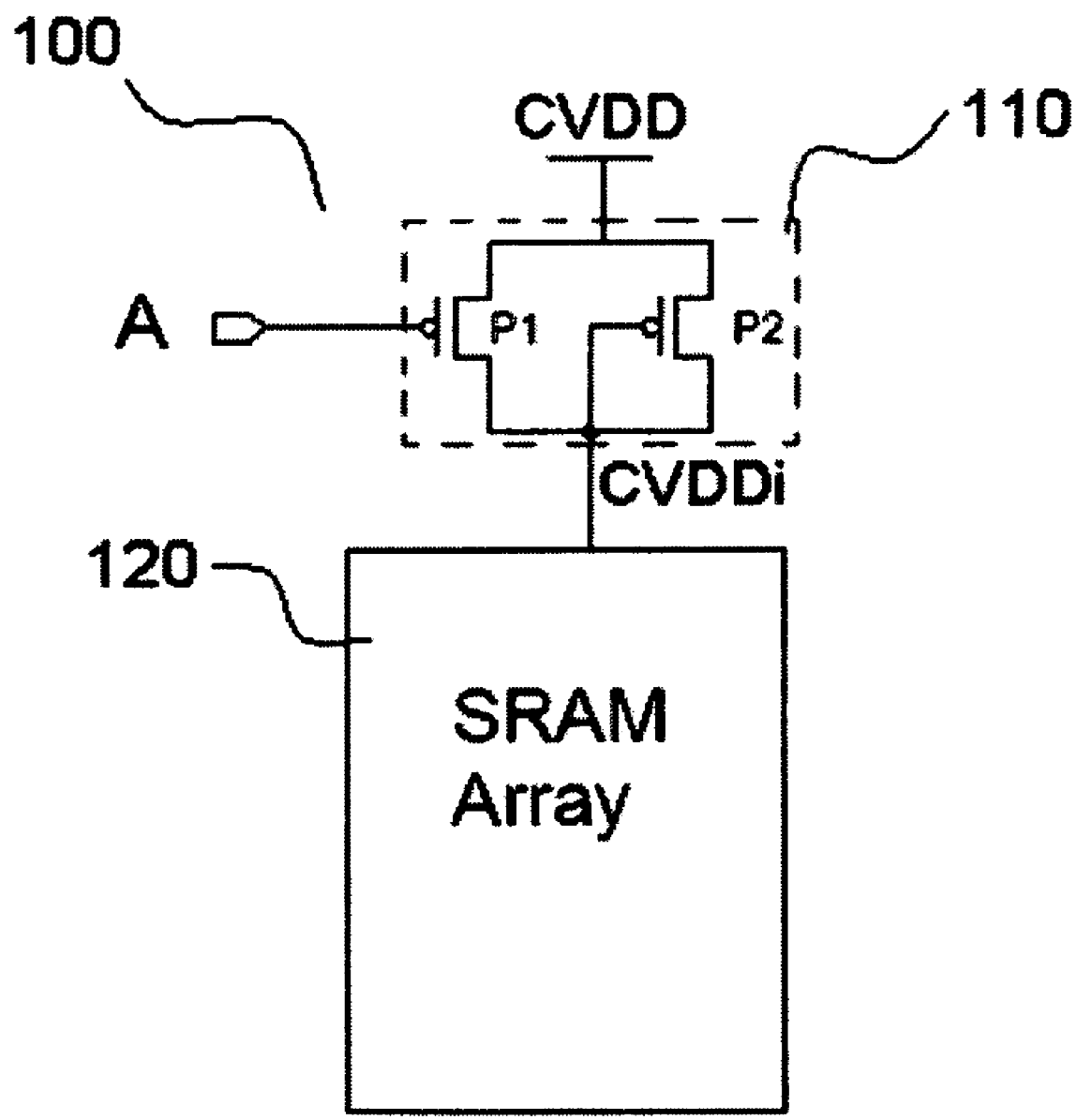
FIG. 1 illustrates a conventional power supply circuit for an SRAM device.
Figure 2:
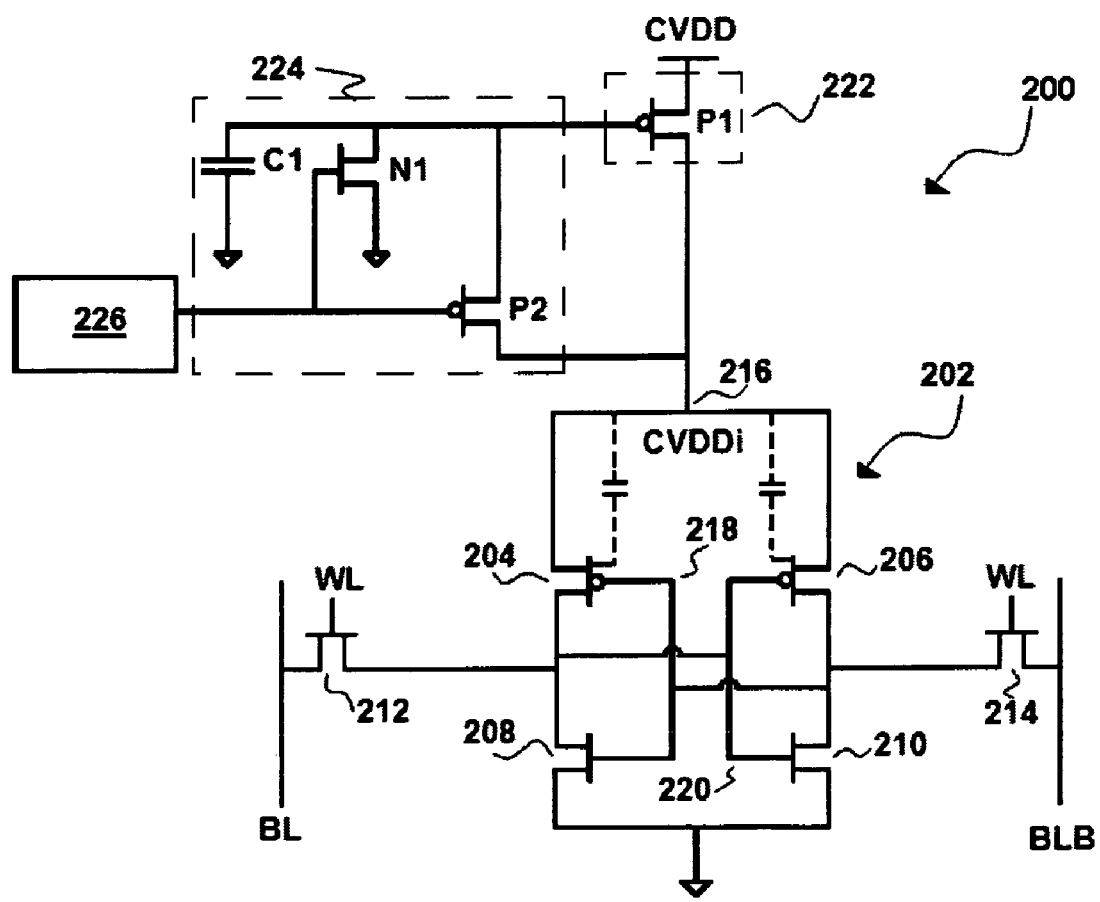
FIG. 2 illustrates a power control circuit coupled to an SRAM cell in accordance with one embodiment of the present invention.

FIG. 2 illustrates a power control circuit 200 coupled to an SRAM cell 202 in accordance with one embodiment of the present invention. The SRAM cell 202 is comprised of PMOS transistors 204 and 206, and NMOS transistors 208, 210, 212 and 214. The PMOS transistor 204 has its source connected to a node 216, and its drain connected to a drain of the NMOS transistor 208. The PMOS transistor 206 has its source connected to the node 216, and its drain connected to a drain of the NMOS transistor 210. The sources of the NMOS transistors 208 and 210 are connected together to a lower level voltage, such as ground voltage or VSS. The gates of the PMOS transistor 204 and the NMOS transistor 208 are connected together to a storage node 218, which is further connected to the drains of the PMOS transistor 206 and the NMOS transistor 210. The gates of the PMOS transistor 206 and the NMOS transistor 210 are connected together to a storage node 220, which is further connected to the drains of the PMOS transistor 204 and the NMOS transistor 208. The NMOS transistor 212 connects the storage node 220 to a bit line BL, and the NMOS transistor 213 connects the storage node 218 to a complementary bit line BLB. The gates of the NMOS transistors 212 and 214 are controlled by a word line WL. When the voltage on the word line WL is a logic "1," the NMOS transistors 212 and 214 are turned on to allow a bit of data to be read from or written into the storage nodes 218 and 220 via the bit line BL and the complementary bit line BLB.

The power control circuit 200 includes at least one switch device 222, a switch control module 224, and a read/write control module 226. The switch device 222 is coupled between a supply voltage CVDD and the node 216 of the SRAM cell 202. The switch control module 224 has two output terminals coupled to the switch device 222 and the node 216, respectively, and one input terminal coupled to the read/write control module 226. In this embodiment, the switch device 222 can be implemented by a PMOS transistor P1, which has a source coupled to the supply voltage CVDD, and a drain coupled to the node 216. The switch control module 224 is comprised of PMOS transistor P2, NMOS transistor N1, and capacitor C1. PMOS transistor P2 has a source coupled to the node 216, and a drain coupled to the gate of PMOS transistor P1 and one electrode of capacitor C1. NMOS transistor N1 has a drain coupled to the gate of PMOS transistor P1 and one electrode of capacitor C1, and a source coupled to a lower level voltage, such as ground voltage or VSS. Capacitor C1 can be constructed in various structures, such as a polysilicon-interpoly-polysilicon (PIP) capacitor, MOS capacitor, or metal-insulator-metal (MIM) capacitor. The gates of NMOS transistor N1 and PMOS transistor P2 are controlled by the read/write control module 226 for being selectively switched on or off depending on the operation mode of the SRAM cell 202. It is noted that although the design details of the read/write control module 226 is not shown in the figure, it is understood by people skilled in the art of integrated circuit design that it can be constructed by at least one inverter, AND, OR, NAND, NOR, XOR, or XNOR gate to provide a desired control signal controlling the transistors P2 and N1.

During read operation, the read/write control module 226 generates a read/write control signal at a high logic level to turn off the PMOS transistor P2 and turn on NMOS transistor N1. The NMOS transistor N1 pulls the voltage at the gate of PMOS transistor P1 to a lower level voltage, such as ground, thereby allowing the supply voltage CVDD to passed to node 216 without a substantial voltage drop. In such case, the intermediate voltage CVDDi on the node 216 substantially equals the supply voltage CVDD.

During write operation, the read/write control module 226 generates a read/write control signal at a low logic level to turn on PMOS transistor P2 and turn off NMOS transistor N1. Capacitor C1 is initially set to have low or no charge. When PMOS transistor P2 is switched on, capacitor C1 is electrically connected to the node 216, which is further connected to one or more parasitic capacitors (shown in dash lines) of the SRAM cell 202. When PMOS transistor P2 is switched on, the charges at the node 216 before PMOS transistor P2 is switched on quickly spreads among capacitor C1 and the parasitic capacitors and reaches an equilibrium point. This phenomenon, referred to as "charge sharing," occurs in a very short period of time. This improves the response time of the power control circuit 224 and therefore the performance of the SRAM cell 202. As such, the intermediate voltage CVDDi on the node 216 can be lowered much faster than what the conventional power control circuits are able to achieve.

Moreover, when PMOS transistor P2 is switched on, the gate of PMOS P1 will be electrically connected to its drain, such that PMOS P1 will be functioning as a MOS diode, which passes the supply voltage CVDD to the node CVDDi with a substantial voltage drop. Thus, in such case, the intermediate voltage CVDDi on node 216 is substantially lower than the supply voltage CVDD. The value of the voltage drop can be adjusted by varying the characteristics of PMOS transistor P1. In this embodiment, the voltage drop can be about 10% to 30% of the supply voltage CVDD. This, in turn, determines the write margin for the SRAM cell 202. Since PMOS P1 is not floating during the write operation, CVDDi on the node 216 will not be pulled to an exceedingly low level. This eliminates negative affects on other SRAM cells, which are not shown in the figure but are also connected to the bit line BL and the complementary bit line BLB.

It is noted that although the above embodiment utilizes an SRAM cell as an example for describing how the power control circuit 200 operates, it can be used for down shifting the supply power for any integrated circuit module that requires the supply voltage to be varied at different levels. For example, the proposed power control circuit can be used to down shift the supply voltage of any logic circuit when it enters a sleep or standby mode. The proposed power control circuit can also be used to down shift the supply voltage of a DRAM device depending on its various operation modes. It is understood by those skilled in the art of integrated circuit design that the above embodiment serves merely as an example to explain the principles of the invention.

Figure 3:
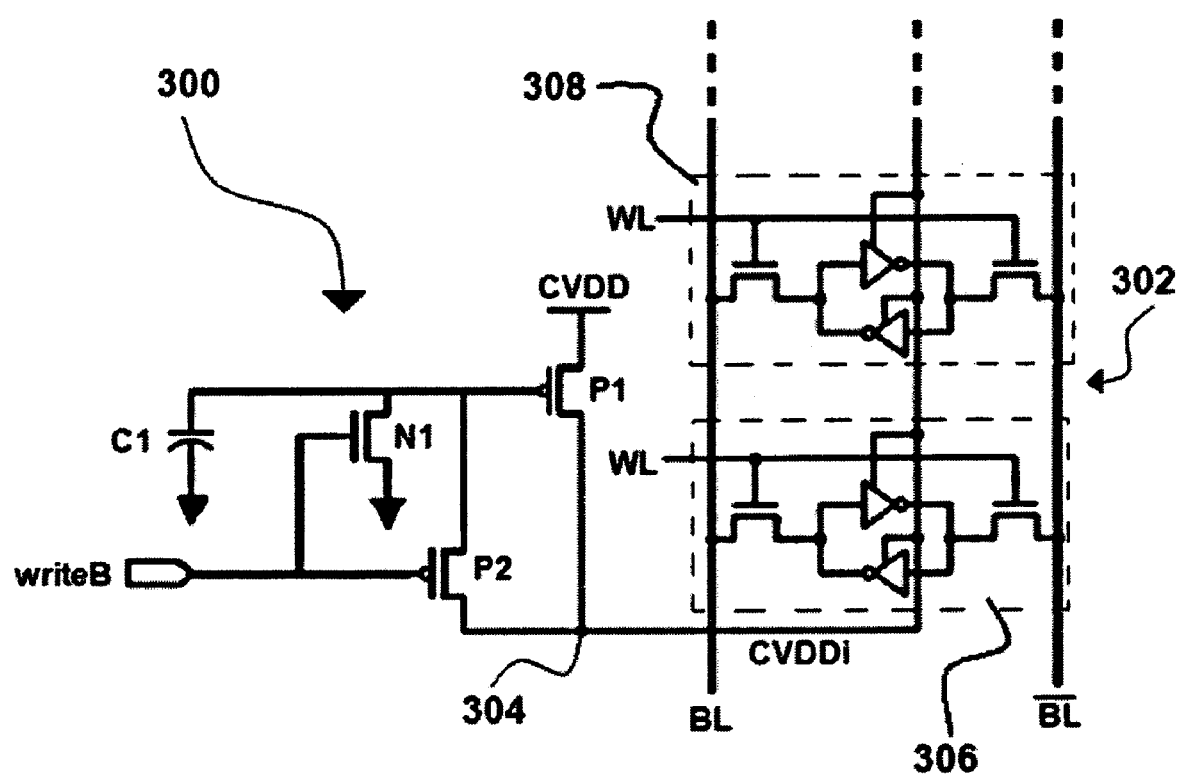
FIG. 3 illustrates a power control circuit coupled to an SRAM array in accordance with another embodiment of the present invention.

FIG. 3 illustrates a power control circuit 300 coupled to a SRAM array 302 in accordance with another embodiment of the present invention. The power control circuit 300 is similar to that shown in FIG. 2, expect that the read/write control module is omitted. The drain of PMOS transistor P1 and the source of PMOS transistor P2 are connected to a node 304, which is further connected to SRAM cells 306 and 308 coupled between a bit line BL and a complementary bit line BLB. The access transistors of the cells 306 and 308 are controlled by two separate word lines WL, such that they can be selected separately by asserting one of the word lines WL. It is noted that although only one column of cells are shown in the figure, the SRAM array 302 can include a plurality of columns, each of which includes more than two cells.

The power control circuit 300 operates similarly to the one shown in FIG. 2. PMOS device P1 acts as a power control between CVDD and CVDDi on node 304. During read operation, the writeB signal is a logical "one" and NMOS device N1 is turned on, lowering the voltage at the gate of PMOS transistor P1 to pass the supply voltage CVDD to node 304. During write operation, the writeB signal is a logical "zero" and the NMOS device N1 is turned off and the PMOS device P2 is turned on. Turning on the PMOS device P2 provides a discharge path for CVDDi on the node 304, such that a portion of the charge at node 304 is transferred to the capacitor C1. By sharing the charge this way, the capacitor C1 acts as a charge sink, thus lowering the voltage CVDDi.

One having skill in the art will appreciate how the circuit of the current disclosure increases the write margin of the memory cells and rapidly reduces the voltage at node 304 (CVDDi) when going into write operation. Rapidly reducing the transition time allows this circuit to be used in higher speed applications than conventional designs.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A power control circuit for an integrated circuit module, comprising:
    at least one switch device coupled between a supply voltage and a node of the integrated circuit module; and
    a switch control module having a first terminal coupled to the switch device and a second terminal coupled to the node of the integrated circuit module for controlling the switch device to pass the supply voltage to the node with or without a substantial voltage drop depending on an operation mode of the integrated circuit module, the switch control module having at least one capacitor for selectively discharging the node, thereby creating the substantial voltage drop for the supply voltage across the switch device,
    wherein the capacitor is not directly connected to the integrated circuit or the node of the integrated circuit.

2. The power control circuit of claim 1, wherein the integrated circuit module is a static random access memory (SRAM) cell or a dynamic random access memory (DRAM) cell.

3. The power control circuit of claim 1, wherein the switch control module comprises a MOS transistor coupled between the capacitor and the node of the integrated circuit module, the MOS transistor being selectively turned on for the capacitor to discharge the node by means of charge sharing with at least one parasitic capacitor of the integrated circuit module depending on an operation mode thereof.

4. The power control circuit of claim 3, wherein the switch device comprises a first PMOS transistor having a source coupled to the supply voltage, a drain coupled to the node of the integrated circuit module, and a gate coupled to the first terminal of the switch control module.

5. The power control circuit of claim 4, wherein the MOS transistor of the switch control module is a second PMOS transistor having a drain coupled between the gate of the first PMOS transistor and the capacitor, and a source coupled between the drain of the first PMOS transistor and the node of the integrated circuit module.

6. The power control circuit of claim 5, wherein the switch control module comprises an NMOS transistor having a drain coupled to the gate of the first PMOS transistor and the capacitor, and a source coupled to a voltage level lower than the supply voltage.

7. The power control circuit of claim 6, further comprising a read/write control module coupled to the gate of the second PMOS transistor and the gate of the NMOS transistor for generating a read/write control signal that turns the NMOS transistor on and the second PMOS transistor off during read operation of the integrated circuit module, and turns the NMOS transistor off and the second PMOS transistor on during write operation of the integrated circuit module.

8. The power control circuit of claim 7, wherein the read/write control module comprises at least one inverter, AND, OR, NAND, NOR, XOR, or XNOR gate.

9. The power control circuit of claim 1, wherein the capacitor is a polysilicon-interpoly-polysilicon (PIP) capacitor, MOS capacitor, or metal-insulator-metal (MIM) capacitor.

10. The power control circuit of claim 1, wherein the voltage drop is about 10% to 30% of the supply voltage.

11. A memory device comprising:
    at least one memory cell;
    at least one switch device coupled between a supply voltage and a node of the memory cell; and
    a switch control module having a first terminal coupled to the switch device and a second terminal coupled to the node of the memory cell for controlling the switch device to pass the supply voltage to the node with or without a substantial voltage drop depending on an operation mode of the memory cell, the switch control module having at least one capacitor coupled to the node of the memory cell through at least one MOS transistor,
    wherein the MOS transistor is selectively turned on for the capacitor to discharge the node by means of charge sharing with at least one parasitic capacitor of the memory cell depending on an operation mode thereof,
    wherein the capacitor is not directly connected to the integrated circuit or the node of the integrated circuit.

12. The memory device of claim 11, wherein the switch device comprises a first PMOS transistor having a source coupled to the supply voltage, a drain coupled to the node of the memory cell, and a gate coupled to the first terminal of the switch control module.

13. The memory device of claim 12, wherein the MOS transistor of the switch control module is a second PMOS transistor having a drain coupled between the gate of the first PMOS transistor and the capacitor, and a source coupled between the drain of the first PMOS transistor and the node of the memory cell.

14. The memory device of claim 13, wherein the switch control module comprises an NMOS transistor having a drain coupled to the gate of the first PMOS transistor and the capacitor, and a source coupled to a voltage level lower than the supply voltage.

15. The memory device of claim 14, further comprising a read/write control module coupled to the gate of the second PMOS transistor and the gate of the NMOS transistor for generating a read/write control signal that turns the NMOS transistor on and the second PMOS transistor off during read operation of the memory cell, and turns the NMOS transistor off and the second PMOS transistor on during write operation of the memory cell.

16. A power control circuit for an integrated circuit module, comprising:
    a first PMOS transistor coupled between a first voltage and a node of the integrated circuit module;
    a second PMOS transistor having a source coupled to the node of the integrated circuit module and a drain coupled to a gate of the first PMOS transistor;

a capacitor coupled between the source of the second PMOS transistor and a second voltage lower than the first voltage; and an NMOS transistor having a drain coupled to the drain of the second PMOS transistor and a source coupled to the second voltage, wherein the second PMOS transistor is selectively turned on for the capacitor to discharge the node by means of charge sharing with at least one parasitic capacitor of the integrated circuit module depending on an operation mode thereof.

17. The power control circuit of claim 16, wherein the integrated circuit module is a static random access memory (SRAM) cell or a dynamic random access memory (DRAM) cell.

18. The power control circuit of claim 17, further comprising a read/write control module coupled to the gate of the second PMOS transistor and the gate of the NMOS transistor for generating a read/write control signal that turns the NMOS transistor on and the second PMOS transistor off during read operation of the integrated circuit module, and turns the NMOS transistor off and the second PMOS transistor on during write operation of the integrated circuit module.

19. The power control circuit of claim 18, wherein the read/write control module comprises at least one inverter, AND, OR, NAND, NOR, XOR, or XNOR gate.

20. The power control circuit of claim 16, wherein the capacitor is a polysilicon-interpoly-polysilicon (PIP) capacitor, MOS capacitor, or metal-insulator-metal (MIM) capacitor.

21. The power control circuit of claim 16, wherein the voltage drop is about 10% to 30% of the first voltage.

* * * * *